United States Patent
Fazelpour et al.

(10) Patent No.: US 9,214,426 B1
(45) Date of Patent: Dec. 15, 2015

(54) HIGHLY COUPLED SPIRAL PLANAR INDUCTORS STRUCTURE AT BUMP TO COMPENSATE ON DIE EXCESS CAPACITANCE OF DIFFERENTIAL I/O

(71) Applicant: QUALCOMM Incorporated, San Diego, CA (US)

(72) Inventors: Siamak Fazelpour, San Diego, CA (US); Priyatharshan Pathmanathan, Raleigh, NC (US); John Stephen Loffink, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/329,889

(22) Filed: Jul. 11, 2014

(51) Int. Cl.
*H01L 23/00* (2006.01)
*H01L 23/522* (2006.01)
*H01L 49/02* (2006.01)

(52) U.S. Cl.
CPC ............ *H01L 23/5227* (2013.01); *H01L 28/10* (2013.01); *H01L 2924/1206* (2013.01); *H01L 2924/19042* (2013.01)

(58) Field of Classification Search
CPC .............. H01L 2924/1206; H01L 2924/19042
See application file for complete search history.

(56) References Cited

U.S. PATENT DOCUMENTS

| | | | |
|---|---|---|---|
| 6,617,943 B1 * | 9/2003 | Fazelpour | 333/204 |
| 6,998,953 B2 | 2/2006 | Yeo et al. | |
| 7,868,409 B2 | 1/2011 | Sasaki | |
| 8,299,572 B2 | 10/2012 | Reisner | |
| 8,368,174 B1 | 2/2013 | Jiang et al. | |
| 2010/0314780 A1 * | 12/2010 | Camacho et al. | 257/777 |
| 2011/0001587 A1 * | 1/2011 | Sutardja | 333/24 R |
| 2012/0261796 A1 | 10/2012 | Meyer-Berg | |

* cited by examiner

*Primary Examiner* — Ngan Ngo
(74) *Attorney, Agent, or Firm* — Muncy, Geissler, Olds & Lowe, P.C.

(57) ABSTRACT

Methods and apparatuses for reducing excess on die capacitance. The method couples a first die pad to a first via. The method couples a second die pad to a second via. The method couples a first inductor to the first die pad and the second via. The method couples a second inductor to the second die pad and the first via.

20 Claims, 6 Drawing Sheets

HIGHLY COUPLED SPIRAL PLANAR INDUCTORS STRUCTURE AT BUMP TO COMPENSATE ON DIE EXCESS CAPACITANCE OF DIFFERENTIAL I/O

BACKGROUND OF THE INVENTION

1. Field of the Invention

Disclosed embodiments relate to coupled spiral planar inductors.

2. Description of the Related Art

Input signals and power are provided to an integrated circuit from a semiconductor package through a series of bump pads. Capacitance associated with the circuitry behind these bump pads is known to introduce significant discontinuities at a die-package interface. These discontinuities greatly degrade the system performance, so that even if the package and associated printed circuit board (PCB) are well-designed, the return loss and insertion loss of the system can be significantly enhanced. If the system loss is large enough, the system loss can lead to possible system specification violations, and the overall system may not deliver the specified amount of performance.

One traditional method used to mitigate the effect of the on-die excess signal capacitance of the integrated circuit can be implemented by using an inductor coil on die to resonate away excess on die signal capacitance. These inductors can require a large amount of silicon space. Likewise, the inductors can add ohmic loss to a signal path as interconnects on die can be lossy. Since excess on die signal capacitance can result in a closed eye at a receiver, the power supply voltage can be increased to open the eye at the receiver. Such a voltage increase, however, can result in additional power dissipation.

FIG. 1 illustrates a perspective-view of an apparatus 100 with an increased power rail voltage to open eye aperture at a receiver. As shown, there is a die pad 102. In some situations, on die excess capacitance of the signal, often due to die electrostatic discharge circuitry (ESD) can represent discontinuity for a digital communication channel. This may in turn reduce eye height (voltage), reduce noise margin, and increase jitter at the receiver.

SUMMARY

The disclosure is directed to coupled spiral planar inductors.

An apparatus can comprise a first die pad coupled to a first via. The apparatus can comprise a second die pad coupled to a second via. The apparatus can comprise a first inductor coupled to the first die pad and the second via. The apparatus can comprise a second inductor coupled to the second die pad and the first via.

A method for reducing excess on die capacitance, the method can comprise coupling a first die pad to a first via. The method can comprise coupling a second die pad to a second via. The method can comprise coupling a first inductor to the first die pad and the second via. The method can comprise coupling a second inductor to the second die pad and the first via.

An apparatus can comprise means for coupling a first die pad to a first via. The apparatus can comprise means for coupling a second die pad to a second via. The apparatus can comprise means for coupling a first inductor to the first die pad and the second via. The apparatus can comprise means for coupling a second inductor to the second die pad and the first via.

The amount of inductor can compensate for excess capacitance. Inductors can be coupled, which can provide a reduction in noise, such as crosstalk, from adjacent electrical components. For example, the apparatus can be a transceiver, and therefore noise from a nearby receiver can be isolated from the transceiver.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

DETAILED DESCRIPTION

Various aspects are disclosed in the following description and related drawings. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 1:
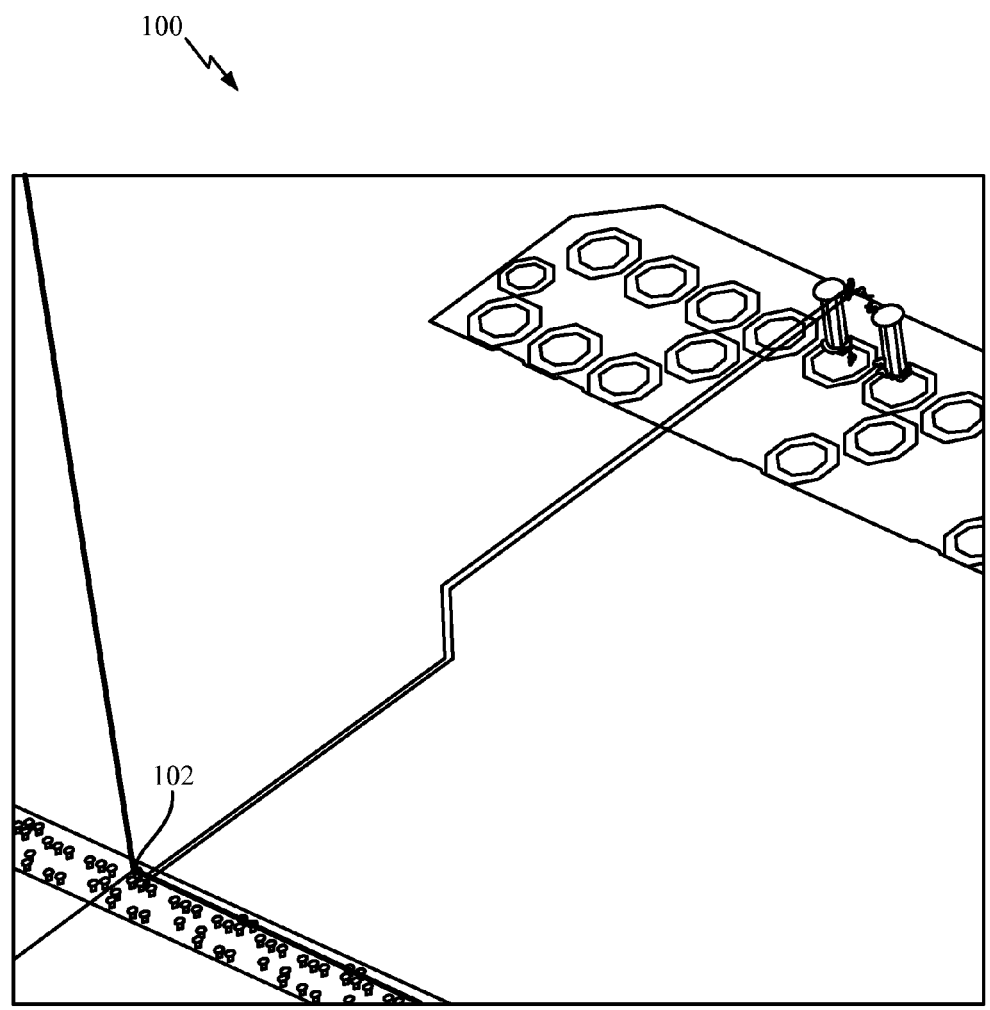
FIG. 1 illustrates a perspective-view of an apparatus with an increased power rail voltage to open eye aperture at a receiver.
Figure 2:
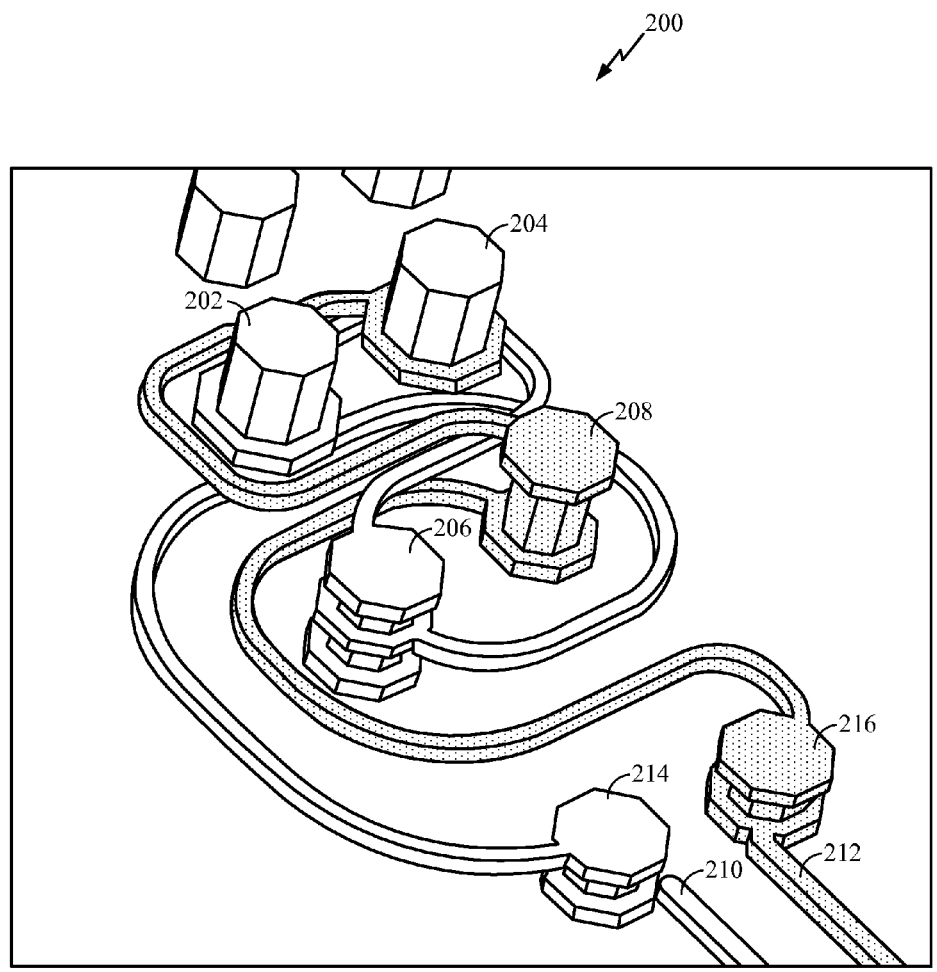
FIG. 2 illustrates a perspective-view of an embodiment of a coupled spiral planar inductor apparatus.

FIG. 2 illustrates a perspective-view of an embodiment of a coupled spiral planar inductor apparatus 200. The apparatus 200 can include a first die pad, shown here as a first die bump 202, and a second die pad, shown as a second die bump 204. The first die bump 202 can be coupled to a first via 206 and the second die bump 204 can be coupled to a second via 208. The first via 206 can be coupled to a positive net of a differential pair (P), which ends its inductor at P trace 210. The second via 208 can be coupled to a negative net of the differential pair (N), which ends its inductor at N trace 212.

The second die bump 204 can be coupled to the second via 208 with a first layer trace routing. The first die bump 202 can be coupled to the first via 206 with a second layer trace routing. In some embodiments, a third via 214 can couple the first via 206 to the P trace 210 at the end of its inductor while a fourth via 216 can couple second via 208 to the N trace 212 at the end of its inductor. As shown, the third via 214 can be coupled to the first via 206 with a third layer trace routing. The P trace 210 at the end of its inductor can be coupled to the third via 214 with a fourth layer trace routing.

In some embodiments, the apparatus 200 can include a plurality of vias, wherein the plurality is a number divisible by two, such as 2, 4, 6, 8, and so on. The numbers of layer trace routing can be proportional to the number of vias. In some embodiments, the first die pad can comprise a first solder ball and the second die pad can comprise a second solder ball.

Figure 3:
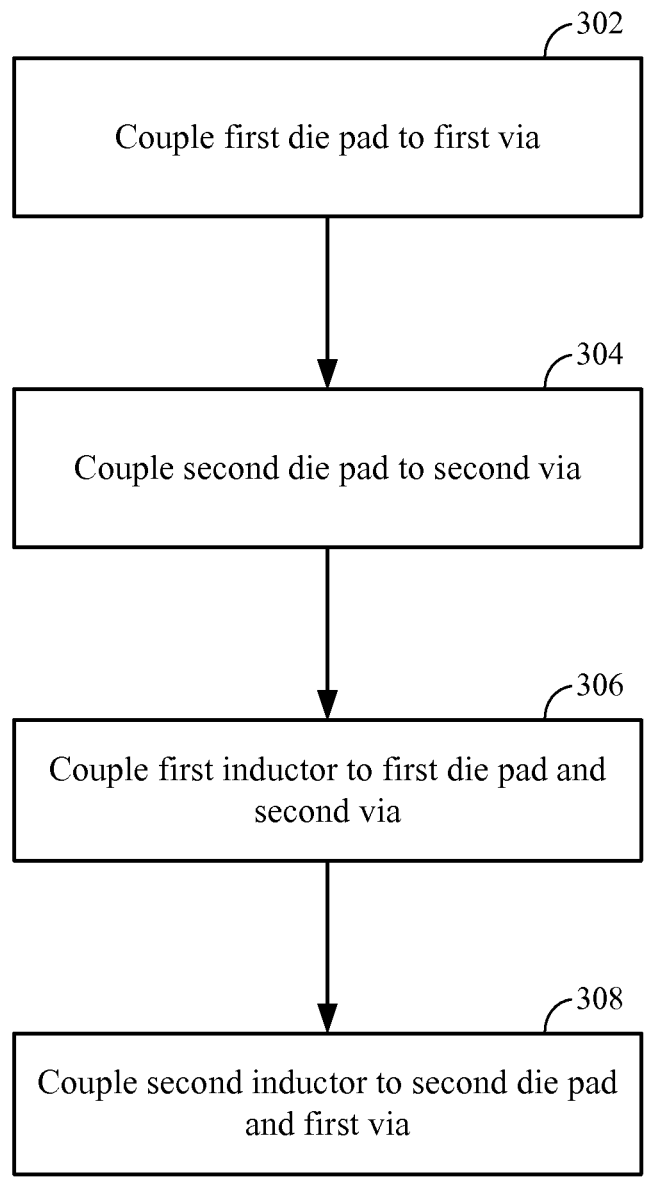
FIG. 3 illustrates an operational flow of a method for reducing excess on die capacitance.

FIG. 3 illustrates an embodiment that can include a method comprising: coupling a first die pad to a first via (e.g., wherein the first die pad is coupled to the first via with a second layer trace routing)—Block 302; coupling a second die pad to a second via (e.g., wherein the second die pad is coupled to the second via with a first layer trace routing)—Block 304; coupling a first inductor to the first die pad and the second via—Block 306; and coupling a second inductor to the second die pad and the first via—Block 308.

Figure 4:
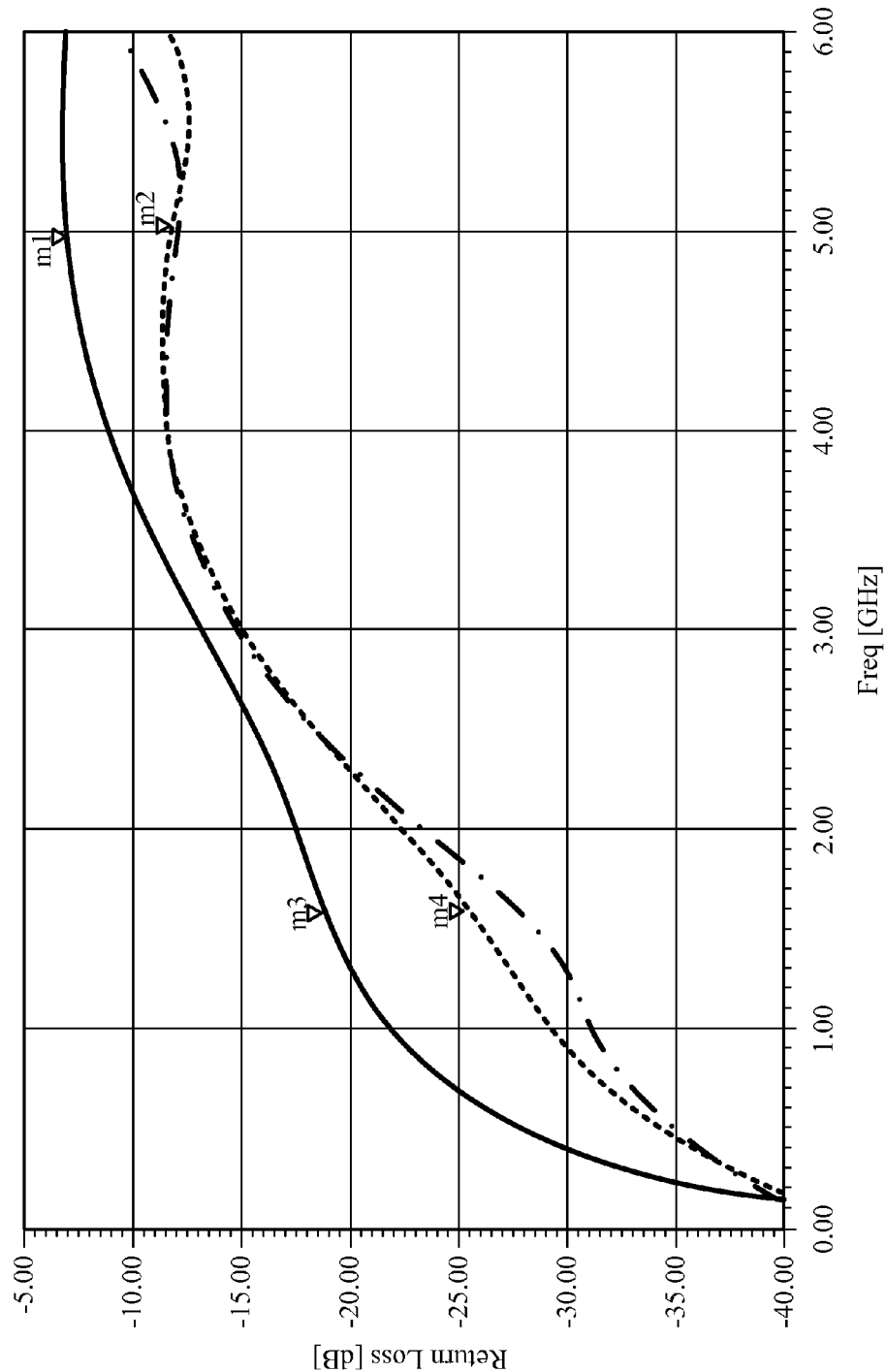
FIG. 4 illustrates a graphical representation of return loss improvement with a coupled inductor.

FIG. 4 illustrates a graphical representation of a comparison of return loss improvement with 1) a device with an exemplary coupled inductor (dotted line) at two different frequencies, 2) a device with no coupled inductor (solid line), and 3) a device with no on die excess capacitance and no inductor at bumps (dash and dot line). As shown at 5 GHz with m1 (on the solid line) as compared to m2 (on the solid line), the return loss improvement can be approximately 5 dB with a coupled inductor. FIG. 4 shows that m3 is without the coupled inductor with excess capacitance at 1.6 GHz. Therefore, m4, which uses a coupled inductor, illustrates the return loss improvement as a difference of more than 5 dB at 1.6 GHz.

Figure 5:
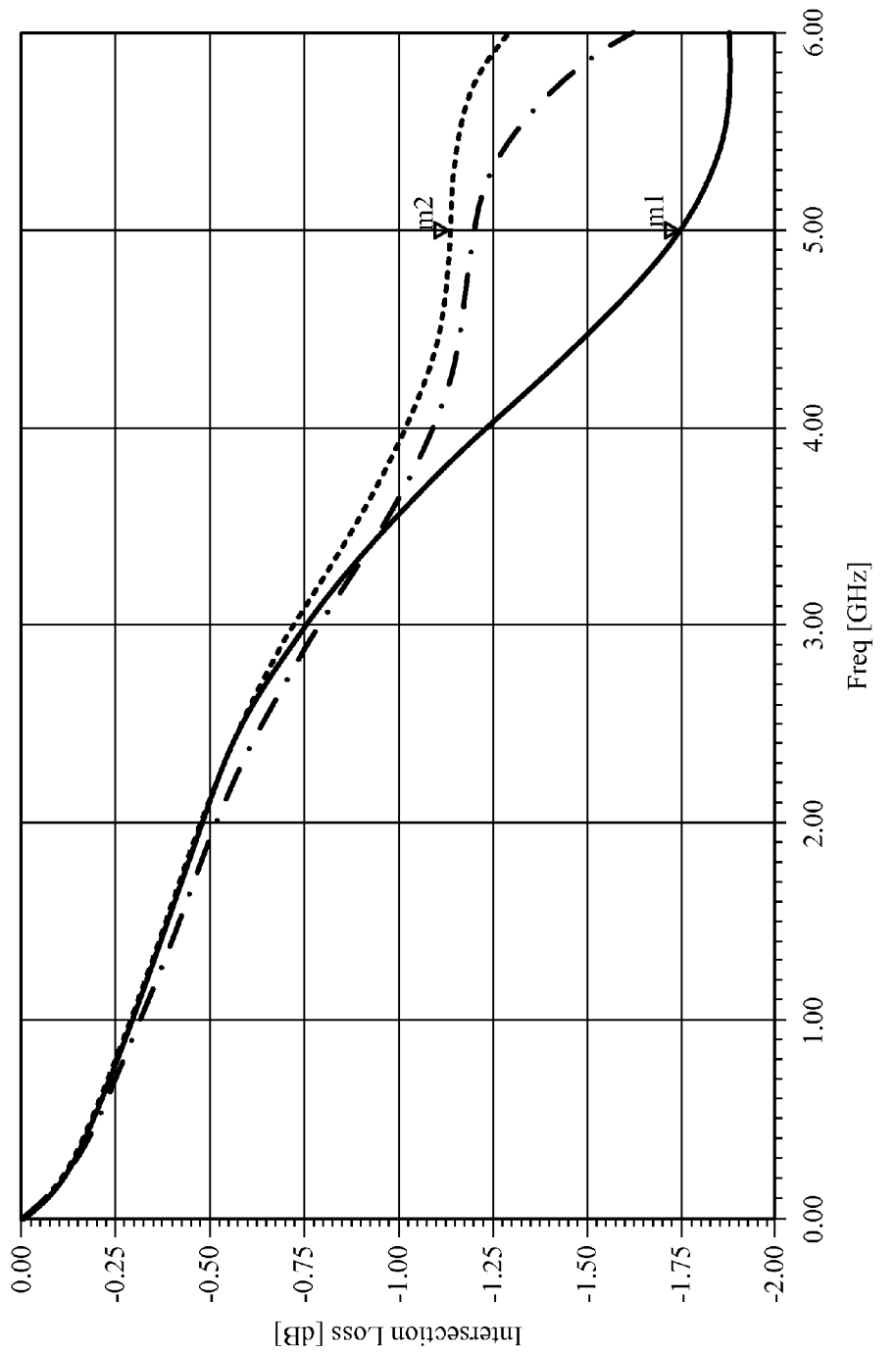
FIG. 5 illustrates a graphical representation of insertion loss improvement with a coupled inductor.

FIG. 5 illustrates a graphical representation of a comparison of insertion loss improvement with 1) a device with an exemplary coupled inductor and excess on die capacitance (dotted line), 2) a device with no coupled inductor but with excess on die capacitance (solid line), and 3) compared with the case of no on die excess capacitance and no inductor at bumps (dash and dot line). As shown with m1 as compared to m2, the insertion loss improvement can be approximately 0.6 dB as a result of a coupled inductor at 5 GHz.

Figure 6:
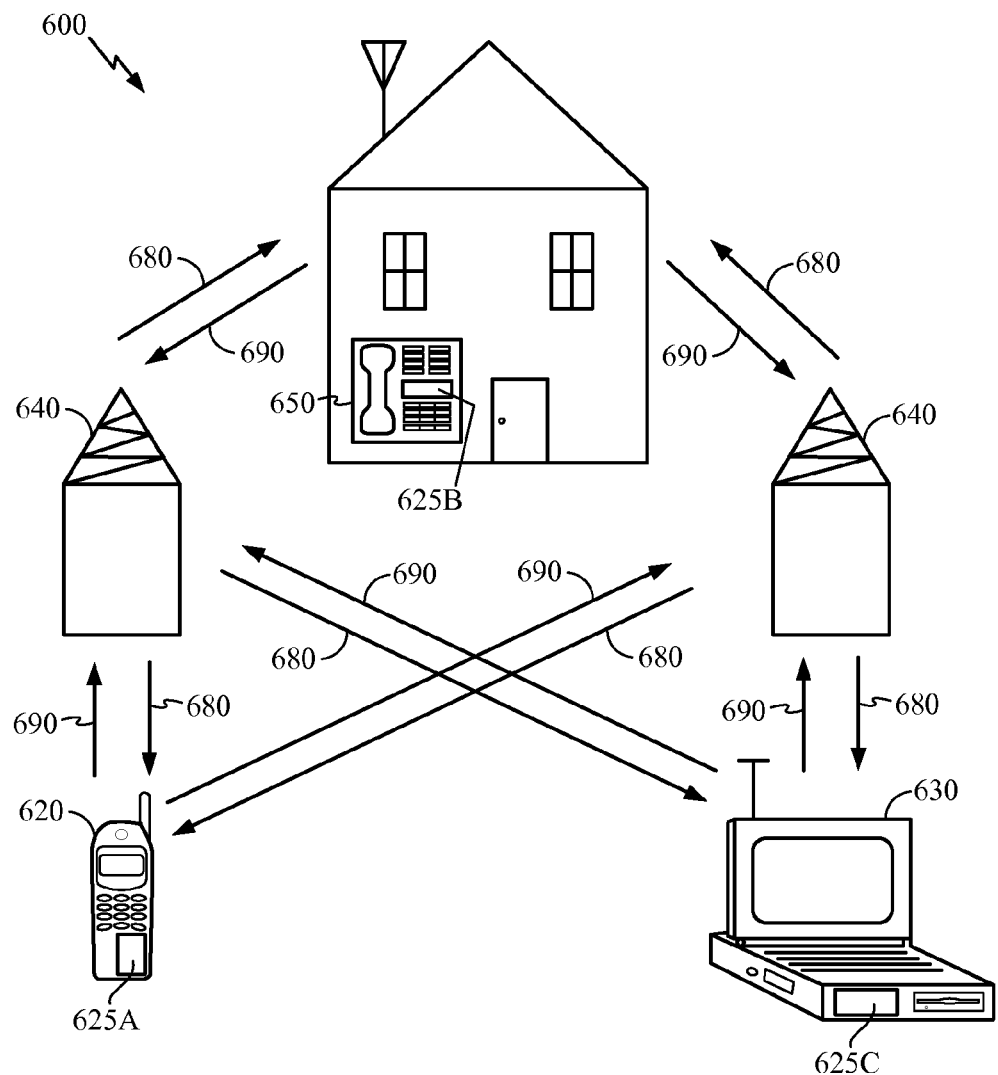
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625B and 625C, as disclosed below. It will be recognized that any device containing an IC may also include a coupled inductor having the disclosed features and/or components manufactured by the processes disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, the remote unit 620 is shown as a mobile telephone, the remote unit 630 is shown as a portable computer, and the remote unit 650 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 6 illustrates remote units according to the teachings of the disclosure, the disclosure is not limited to these exemplary illustrated units. The disclosure may be suitably employed in any device which includes a coupled inductor, as described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an electronic object. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, DVD, floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus comprising:
   a first die pad coupled to a first via;
   a second die pad coupled to a second via;
   a first inductor coupled to the first die pad and the second via; and
   a second inductor coupled to the second die pad and the first via.

2. The apparatus of claim 1, wherein the second die pad is coupled to the second via with a first layer trace routing.

3. The apparatus of claim 1, wherein the first die pad is coupled to the first via with a second layer trace routing.

4. The apparatus of claim 1, further comprising a third via and a fourth via.

5. The apparatus of claim 4, wherein the third via is coupled to the first via with a third layer trace routing.

6. The apparatus of claim 4, wherein a P inductor is coupled to the third via with a fourth layer trace routing.

7. The apparatus of claim 1, further comprising a plurality of vias, wherein the plurality of vias is a number divisible by two.

8. The apparatus of claim 7, wherein a number of a plurality of layer trace routing is proportional to the number of the plurality of vias.

9. The apparatus of claim 1, wherein the first die pad is a first die bump and the second die pad is a second die bump.

10. The apparatus of claim 1, wherein the first die pad is a first solder ball and the second die pad is a second solder ball.

11. A method for reducing excess on die capacitance, the method comprising:
    coupling a first die pad to a first via;
    coupling a second die pad to a second via;
    coupling a first inductor to the first die pad and the second via; and
    coupling a second inductor to the second die pad and the first via.

12. The method of claim 11, further comprising coupling the second die pad to the second via with a first layer trace routing.

13. The method of claim 11, further comprising coupling the first die pad to the first via with a second layer trace routing.

14. The method of claim 11, further comprising coupling a third via to the first via and a fourth via to the second via.

15. The method of claim 11, further comprising coupling the third via to the first via with a third layer trace routing.

16. The method of claim 11, further comprising coupling a P inductor to the third via with a fourth layer trace routing.

17. The method of claim 11, further comprising coupling a plurality of vias coupled to the first via and the second via, wherein the plurality of vias is a number divisible by two.

18. The method of claim 11, wherein the first die pad is a first die bump and the second die pad is a second die bump.

19. The method of claim 11, wherein the first die pad is a first solder ball and the second die pad is a second solder ball.

20. An apparatus comprising:
    means for coupling a first die pad to a first via;
    means for coupling a second die pad to a second via;
    means for coupling a first inductor to the first die pad and the second via; and
    means for coupling a second inductor to the second die pad and the first via.

* * * * *